April 11, 1967 J. L. BOYER 3,313,987

COMPRESSION BONDED SEMICONDUCTOR DEVICE

Filed April 22, 1964

INVENTOR.
JOHN L. BOYER
BY
OSTROLENK, FABER, GERB & SOFFEN
ATTORNEYS 3,313,987

COMPRESSION BONDED SEMICONDUCTOR DEVICE

John L. Boyer, El Segundo, Calif., assignor to International Rectifier Corporation, El Segundo, Calif., a corporation of California Filed Apr. 22, 1964, Ser. No. 361,827
2 Claims. (Cl. 317—234)

This invention relates to a semiconductor wafer assembly, and more specifically relates to a stud mounted semiconductor assembly which is compression bonded.

Compression bonded semiconductor devices are extremely desirable particularly for large area semiconductor wafers. In such devices a solder joint is eliminated between the housing terminals and the wafer structure whereby a sliding effect is permissible at the compression joint. Therefore, the device will be able to withstand many thermal cycles, even though the expansion characteristics of the electrode materials are not closely matched.

Such arrangements are relatively easily formed where the wafer is mounted between the cooling fins. A typical example of this type arrangement is set forth in my copending U.S. application Ser. No. 361,400, filed April 21, 1964, entitled, "Compression Connected Semiconductor Device," and assigned to the assignee of the instant invention.

However, where a compression bonded arrangement is desired for a stud mounted type of housing, many problems arise in the application of compression bonding since the same space must be used for the stud mounted device as previously used for the soldered device.

More particularly, and in accordance with the invention, a novel compression bonding structure is provided for stud mounted devices wherein compression force is obtained from the outside of the encapsulated structure. This permits a standard encapsulated structure which can be used with many types of equipment and with many different mounting designs.

More particularly, and in accordance with the invention, a standard encapsulated structure is subassembled with the main mounting studs thereafter being connected to this subassembly with pressure being applied between the mounting studs to bias them toward one another, for example, by means of a suitable Belleville washer or spring which is external of the encapsulated housing.

Accordingly, a primary object of this invention is to provide a novel compression bonded semiconductor device.

Another object of this invention is to provide a novel compression bonding structure for application to stud mounted type devices.

A still further object of this invention is to provide a novel subassembly of a wafer with conductive members adjacent either of its sides which can be compression bonded to the wafer upon the application of a suitable clamping structure in a stud mounted structure.

These and other objects of this invention will become apparent from the following description when taken in connection with the drawings, in which.

Figures 1, 2, 3:
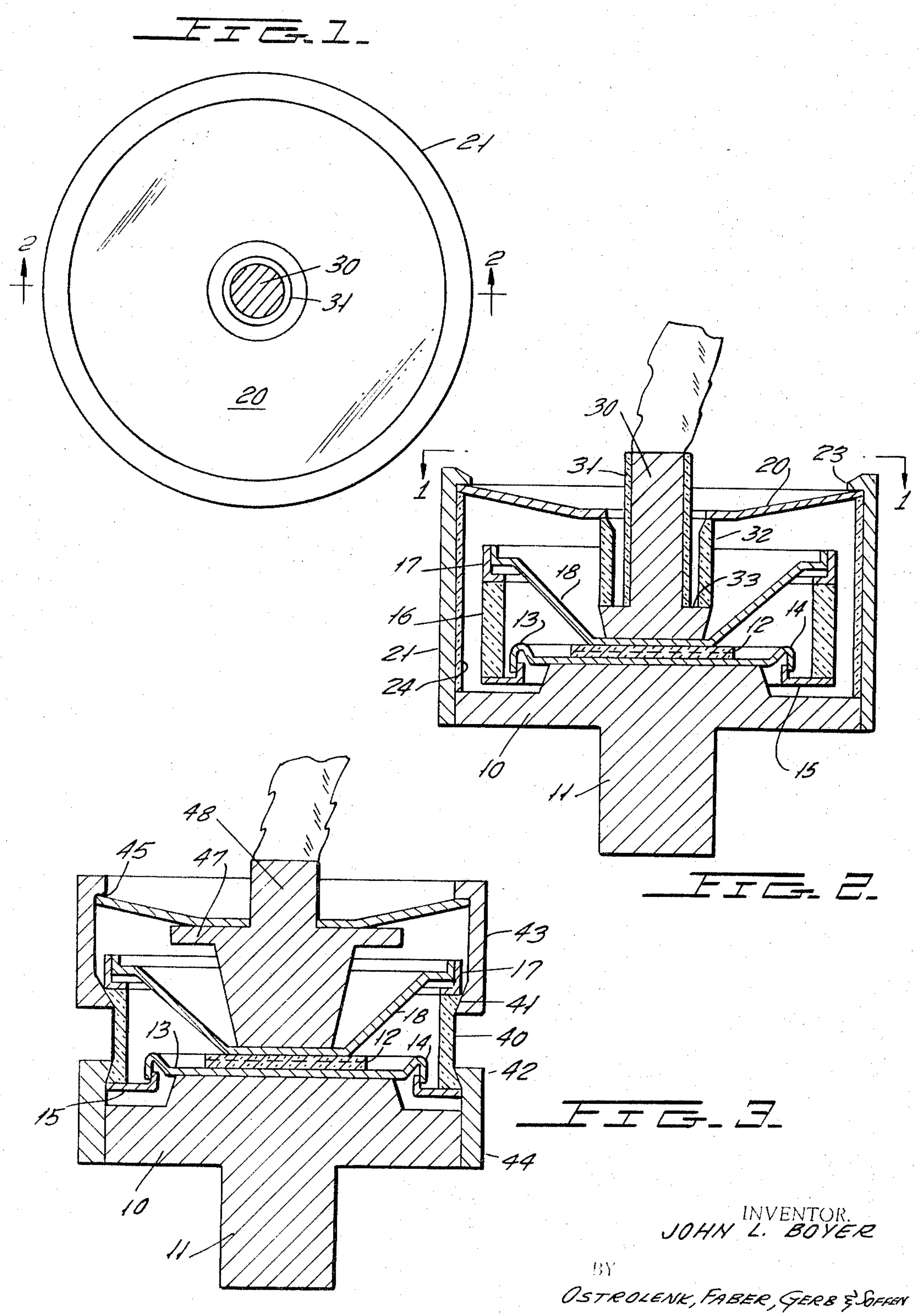
FIGURE 1 is a top cross-sectional view of a stud mounted semiconductor device manufactured in accordance with the invention and taken across lines 1—1 in FIGURE 2.
FIGURE 2 is a cross-sectional view of FIGURE 1 taken across the lines 2—2 in FIGURE 1.
FIGURE 3 is a cross-sectional view similar to FIGURE 2 of a second embodiment of the invention.

Referring first to FIGURES 1 and 2, I have illustrated therein a stud mounted type of semiconductor device which includes a conductive base member 10 which could be of copper and may have an extending stud 11 which may be threaded in the usual manner.

The mounting member 10 then receives a subassembly constructed in accordance with the invention which includes a silicon wafer 12 which, as illustrated by dotted lines, may have at least one, or more than one P-N junctions therein. The wafer 12 is then held in the subassembly which includes a bottom silver header 13 which is a flat silver plate having a brazing flange 14. The flange 14 is then suitably secured by soldering or brazing to the brazing ring 15 which is suitably secured to the bottom of the ceramic spacing cylinder 16. The ceramic cylinder 16 then has an upper brazing flange 17 suitably secured thereto wherein the brazing ring 17 receives the dish-shaped upper silver header 18. The upper header 18 then seats directly atop wafer 12 whereby the wafer 12 is captured between headers 13 and 18.

This assemblage may be formed as a subassembly whereupon the application of suitable compression forces from some external mounting structure will complete the electrical connection through the external mounting structure, the silver headers 13 and 18, and the wafer 12.

Clearly, the subassembly described to this point may be used in any type of compression mounting application. However, this subassembly is particularly well adapted for use with a stud mounted device of the type shown in the figures.

In accordance with the first embodiment of the invention, and as best seen in FIGURE 2, this subassembly is laid atop the mounting member. A spring-type washer such as the Belleville 20 is then dropped into the metal tube 21 which has a peened-over upper lip section 23.

The internal diameter of tube 21 is formed to cooperate substantially identically with the periphery of member 10. Thus, if member 10 is circular, the interior diameter of tube 21 will similarly be circular. Clearly, where member 10 is of the hexagonal type, then the tube 21 will also be of hexagonal cross-section.

After the placement of spring washer 20 in tube 21, an insulation tube 24 is placed in the tube which could be of any desired material such as impregnated mica.

An upper main conductive stud or electrode 30 is then placed atop member 10, as illustrated, where the electrode 30 may have an insulation sheath thereon which again may be of impregnated mica.

A ceramic tube 32 is then seated on shoulder 33 of stud 30, wherein the upper end of insulation 32 serves as a seat for the inner diameter of washer 20. Note that the inner diameter of washer 20 is sufficiently large to prevent accidental short circuiting of the washer to the conductive portions of stud 30. The insulation sheath 31 is particularly used to prevent any possible accidental short circuiting of this type.

The metallic tube 21 along with washer 20 is then forced downwardly and encloses the extending flange of member 10, and the bottom of tube 21 is then brazed to the exterior of member 10. Clearly, in this operation, a stress is applied to washer 20 whereby a compression force exists between the interfaces of members 10 and 30 and the interposed headers 30 and 18, respectively, and wafer 12.

Thus, a compression force causes the effective conductive and thermal bonding of this subassembly without the need for solder, whereby the materials selected for the various components of the assembly may have different thermal expansion characteristics, since the components will be able to slide with respect to one another upon differential expansion.

Note that the volume defined between headers 13 and 18 could be filled with some suitable flexible potting medium or a high pressure, high dielectric gas with care being taken not to cause an insulation gap between the headers and the wafer 12. Thereafter, the volume existing between the subassembly and the interior of tube 21 can be further potted with some suitable compound or gas.

It is to be particularly noted that with the arrangement of FIGURE 2, the ceramic members 16 and 32 are subject only to compression forces. The tube 21 is subjected to tension forces, but this is a high strength metallic tube which can adequately handle such tension forces.

In the arrangement described in FIGURES 1 and 2, it is seen that two separate insulators 16 and 32 were used. FIGURE 3 describes an arrangement wherein only a single insulator is required.

More particularly, in FIGURE 3 where components identical to those of FIGURE 2 have similar identifying numerals, it will be seen that the initial subassembly including headers 13 and 18 are substantially identical to that of FIGURE 2.

This subassembly, however, differs in one respect in that the ceramic spacer 40 has tapered bearing surfaces 41 and 42 thereon. The tapered bearing surfaces 41 and 42 then receive cooperating bearing surfaces of steel rings 43 and 44, respectively. The ring 43 then has an internal shoulder 45 which receives the washer spring 46 which bears on the interior of flange 47 of the upper terminal assembly or stud 48.

In the assembly of FIGURE 3, it is apparent that after rings 43 and 44 are subassembled on ceramic spacer 40, the ring 44 will be brazed to the periphery of stud 11, while the ring 43, acting through spring 46, will cause the compression force required for the low resistance electrical connection of member 10, header 13, wafer 12, header 18, and stud 48.

Note, however, in FIGURE 3 that the structure is simplified as compared to that of FIGURE 2, since only a single ceramic spacer is used. Moreover, the ring 43 may be directly connected to stud 48 since an insulation gap exists at spacer 40.

In the design of FIGURE 3, the rings 43 and 44 are preferably of a low thermal expansion material which is similar in nature to that of the ceramic ring 40 to prevent loosening during thermal cycling.

It will also be noted in FIGURE 3 that the ceramic member 40 is placed in tension, and in this regard it is less desirable than the arrangement of FIGURE 2.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. In combination, a subassembly including a semiconductor wafer, a lower conductive mounting stud, an upper conductive mounting stud, an upper and lower conductive header and an insulation ring connected between the outer peripheries of said upper and lower conductive headers and sealing the volume interior of said headers; said upper and lower conductive headers having central flat sections; said semiconductor wafter being positioned between said central flat sections of said upper and lower headers; said wafer being laterally movable with respect to said central flat sections of said upper and lower headers; said central flat section of said lower header being mechanically and electrically connected to said lower conductive mounting stud; said central flat section of said upper header being mechanically and electrically connected to said upper conductive mounting stud; said upper conductive stud having a shoulder therein; a spring washer having a central opening therein; said spring washer having a uniform thickness; first and second axially spaced conductive tubular end rings; said insulation ring interposed between and mechanically connected to the opposing ends of said first and second tubular end rings; the upper end of said first tubular end ring directly mechanically connected to the outer periphery of said spring washer; the lower end of said second tubular end ring directly connected to said lower conductive stud; the inner diameter of said central opening of said spring washer being mechanically connected to said shoulder of said upper conductive stud thereby to apply a compressive force to said upper and lower headers and said wafer interposed therebetween.

2. The device substantially as set forth in claim 1 wherein the upper and lower outer peripheral portions of said insulation ring contain inwardly sloping surfaces; the interior surfaces adjacent the opposing ends of said first and second tubular end rings having respective outwardly sloping surfaces in engagement with the respective inwardly sloping surfaces in the exterior of said insulation ring, thereby to mechanically connect said first and second tubular end rings of said insulation ring.

References Cited by the Examiner

UNITED STATES PATENTS

| | | | |
|---|---|---|---|
| 2,946,935 | 7/1960 | Finn | 317—234 |
| 3,030,558 | 4/1962 | Berg et al. | 317—234 |
| 3,221,219 | 11/1965 | Emeis et al. | 317—234 |
| 3,226,466 | 12/1965 | Martin | 317—234 X |
| 3,238,425 | 3/1966 | Geyer | 317—234 |

FOREIGN PATENTS

| | | |
|---|---|---|
| 245,912 | 7/1963 | Australia. |
| 875,823 | 8/1961 | Great Britain. |

JOHN W. HUCKERT, *Primary Examiner.*

A. M. LESNIAK, *Assistant Examiner.*